(12) United States Patent
Pen et al.

(10) Patent No.: US 9,867,290 B2
(45) Date of Patent: Jan. 9, 2018

(54) SELECTIVE SEGMENT VIA PLATING PROCESS AND STRUCTURE

(71) Applicant: Multek Technologies Ltd., San Jose, CA (US)

(72) Inventors: Kwan Pen, Guandong (CN); Pui Yin Yu, Tsuen Wan (HK)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 14/834,205

(22) Filed: Aug. 24, 2015

(65) Prior Publication Data

US 2016/0278208 A1    Sep. 22, 2016

(30) Foreign Application Priority Data

Mar. 19, 2015 (CN) .......................... 2015 1 0121886
Mar. 23, 2015 (CN) .......................... 2015 1 0127856

(51) Int. Cl.
*H05K 1/02* (2006.01)
*H05K 1/11* (2006.01)
(Continued)

(52) U.S. Cl.
CPC ........... *H05K 1/115* (2013.01); *H05K 1/0216* (2013.01); *H05K 1/112* (2013.01); *H05K 3/0058* (2013.01);
(Continued)

(58) Field of Classification Search
CPC H01L 23/5226; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H05K 2201/09518; H05K 2201/09527; H05K 2201/09536; H05K 2201/09545; H05K 2201/09554; H05K 2201/09581; H05K 2201/096; H05K 2201/09609;
(Continued)

(56) References Cited

U.S. PATENT DOCUMENTS 4,338,149 A    7/1982    Quaschner
5,116,440 A    5/1992    Takeguchi
(Continued)

OTHER PUBLICATIONS

Non-Final Office Action dated Oct. 31, 2016, U.S. Appl. No. 14/834,180, filed Aug. 24, 2015, applicant; Kwan Pen, 19 pages.
(Continued)

*Primary Examiner* — Ishwarbhai B Patel
(74) *Attorney, Agent, or Firm* — Haverstock & Owens LLP

(57) ABSTRACT

A selective segment via plating process for manufacturing a circuit board selectively interconnects inner conductive layers as separate segments within the same via. Plating resist is applied to a conductive layer of an inner core and then stripped off after an electroless plating process. Stripping of the electroless plating on the plating resist results in a plating discontinuity on the via wall. In a subsequent electroplating process, the plug non-conductive layer can not be plated due to the plating discontinuity. The resulting circuit board structure has separate electrically interconnected segments within the via.

16 Claims, 8 Drawing Sheets

(51) Int. Cl.
*H05K 3/42* (2006.01)
*H05K 3/46* (2006.01)
*H05K 3/00* (2006.01)
*H05K 3/06* (2006.01)
*H05K 3/18* (2006.01)

(52) U.S. Cl.
CPC ............... *H05K 3/06* (2013.01); *H05K 3/181* (2013.01); *H05K 3/188* (2013.01); *H05K 3/42* (2013.01); *H05K 3/422* (2013.01); *H05K 3/424* (2013.01); *H05K 3/429* (2013.01); *H05K 3/4623* (2013.01); *H05K 3/4638* (2013.01); *H05K 1/0298* (2013.01); *H05K 3/4602* (2013.01); *H05K 2201/095* (2013.01); *H05K 2201/09545* (2013.01); *H05K 2201/09554* (2013.01); *H05K 2201/10303* (2013.01)

(58) Field of Classification Search
CPC .......... H05K 2201/09618; H05K 2201/09627; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 3/4602
See application file for complete search history.

(56) References Cited

U.S. PATENT DOCUMENTS

| | | |
|---|---|---|
| 5,121,297 A | 6/1992 | Haas |
| 5,175,047 A | 12/1992 | McKenney |
| 5,206,463 A | 4/1993 | DeMaso |
| 6,541,712 B1* | 4/2003 | Gately .................. H05K 1/115 174/258 |
| 7,322,833 B1 | 1/2008 | Hakansson |
| 8,063,316 B2 | 11/2011 | Gorcea |
| 8,222,537 B2* | 7/2012 | Dudnikov, Jr. ...... H05K 1/0257 174/256 |
| 8,230,592 B2 | 7/2012 | Kuczynski et al. |
| 8,302,301 B2 | 11/2012 | Lau |
| 8,385,073 B2 | 2/2013 | Tam et al. |
| 8,525,646 B2 | 9/2013 | Tamm et al. |
| 8,667,675 B2 | 3/2014 | Dudnikov, Jr. |
| 9,053,405 B1 | 6/2015 | Liu et al. |
| 9,092,712 B2 | 7/2015 | Kroener et al. |
| 9,117,991 B1 | 8/2015 | Olson et al. |
| 9,338,899 B2 | 5/2016 | Lee |
| 2005/0079289 A1* | 4/2005 | Farquhar ................ H05K 3/429 427/230 |
| 2007/0117261 A1 | 5/2007 | Ueno |
| 2012/0181074 A1 | 7/2012 | Ishihara |
| 2012/0234587 A1* | 9/2012 | Nakamura ............. H05K 1/115 174/260 |
| 2014/0262455 A1* | 9/2014 | Iketani .................. H05K 3/429 174/255 |
| 2015/0376444 A1 | 12/2015 | Saito |
| 2016/0021762 A1* | 1/2016 | Kallman ................ H05K 3/429 174/266 |

OTHER PUBLICATIONS

Non-Final Office Action dated Nov. 1, 2016; U.S. Appl. No. 14/834,205, filed Aug. 24, 2015, applicant; Kwan Pen, 22 pages.

* cited by examiner

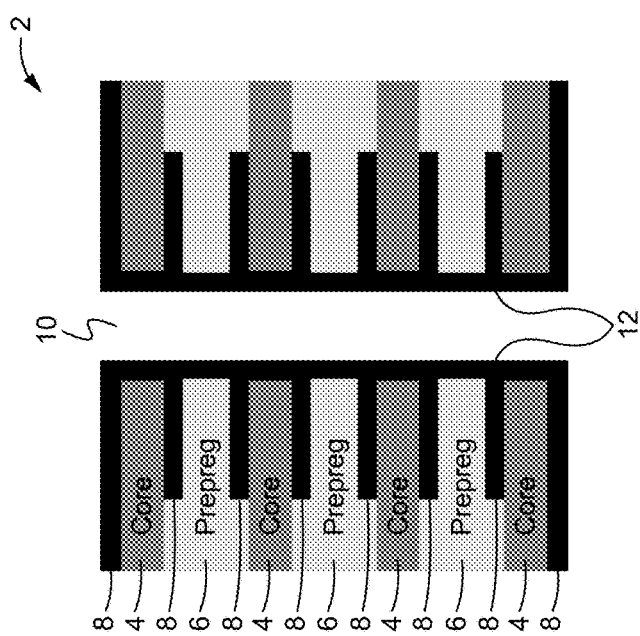
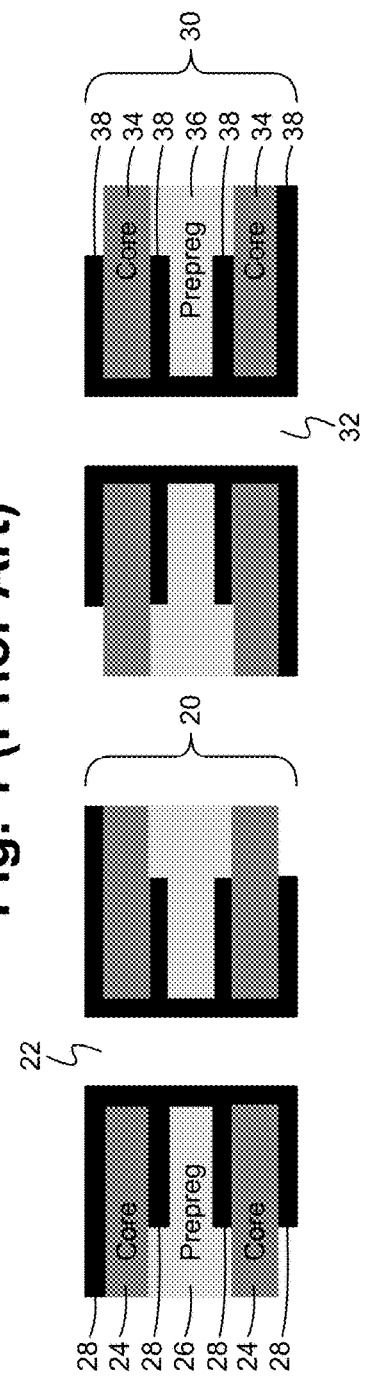
Fig. 1 (Prior Art)
Fig. 2 (Prior Art)

SELECTIVE SEGMENT VIA PLATING PROCESS AND STRUCTURE

CROSS-REFERENCE TO RELATED APPLICATION(S)

This application claims priority under 35 U.S.C. §119(a)-(d) of the Chinese Patent Application No: 201510127856.X, filed Mar. 23, 2015 and titled, "SELECTIVE SEGMENT VIA PLATING PROCESS AND STRUCTURE," and the Chinese Patent Application No: 201510121886.X, filed Mar. 19, 2015 and titled, "SELECTIVE SEGMENT VIA PLATING PROCESS AND STRUCTURE," which are both hereby incorporated by reference in their entireties for all purposes.

FIELD OF THE INVENTION

The present invention is generally directed to printed circuit boards. More specifically, the present invention is directed to printed circuit boards having selective segment via plating.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate laminations. Conductors on different layers are interconnected with plated-through holes called vias.

FIG. 1 illustrates a cut out side view of a portion of a conventional printed circuit board. The printed circuit board 2 includes a plurality of stacked layers, the layers made of non-conductive layers 4, 6 and conductive layers 8. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via 10 is then formed by drilling a hole through the laminated stack and plating the wall of the hole with electrically conductive material, such as copper. The resulting plating 12 interconnects the conductive layers 8.

In the exemplary application shown in FIG. 1, the plating 12 extends uninterrupted through the entire thickness of the via 10, thereby providing a common interconnection with each and every conductive layer 8. In other applications, it may be desired that only certain conductive layers be commonly interconnected by the plating within the via. The commonly interconnected layers are referred to as segments. Formation of segments requires a break in the via wall plating, however, the plating process that forms the plating on the via walls is commonly applied to the entire wall surface. Therefore, to form the necessary plating breaks, the printed circuit board is formed as separate subassembly stacks that are laminated together. Each subassembly laminated stack has the desired plated via, but when laminated together the plated vias from each subassembly laminated stack are separated by a non-conductive material that forms a break in the overall via wall plating. FIG. 2 illustrates a cut out side view of a portion of two conventional subassembly stacks that are to be subsequently used to form a printed circuit board. A subassembly laminated stack 20 includes non-conductive layers 24, 26 and conductive layers 28. The non-conductive layers 24 and the conductive layers 28 form core structures, which are laminated together with intervening non-conductive layer 26, such as prepreg. A via 22 is formed by drilling a hole through the laminated stack and plating the wall of the hole with electrically conductive material. The resulting plating interconnects the conductive layers 28. A second subassembly laminated stack 30 is similarly formed and includes a laminated stack of non-conductive layers 34, 36 and conductive layers 38, and plated via 32. To form the completed printed circuit board, the two subassemblies 20 and 30 are stacked such that the corresponding vias 22 and 32 are aligned, and laminated together with intervening non-conductive layer 40, as shown in FIG. 3. The non-conductive layer 40 provides a break in the conductive plating of via 22 and the conductive plating of via 32, thereby forming two separate segments in the printed circuit board of FIG. 3.

The process shown in FIGS. 2 and 3 is referred to as sequential lamination. A problem with sequential lamination is that it is difficult to exactly align the vias of the stacked subassemblies. As shown in FIG. 3, a via center line 42 of the via 22 in subassembly 20 is not exactly aligned with a via center line 44 of the via 32 in subassembly 30. This is known as layer to layer mis-registration and can lead to performance issues.

In some applications, one or more of the conductive layers closest to the top or bottom surface of the printed circuit board are not designed to be interconnected to the via plating. To sever this connection for these one or more conductive layers, a back drill process is performed where the hole is drilled into the printed circuit board at the via. The hole diameter is wider than the via diameter such that the drilled hole removes the wall plating thereby removing the interconnect plating between conductive layers. FIG. 4 illustrates a cut out side view of a portion of a conventional circuit board having the via back drilled. The printed circuit board 52 is similar to the printed circuit board 2 of FIG. 1 except that a hole 64 has been back drilled into the printed circuit board 52. The back drilled hole 64 removes the corresponding portion of the plating 62 in the via 60 co-located with the bottom few layers of the printed circuit board 52. The remaining plating 62 provides an interconnect for the conductive layers 58, however, the bottom most conductive layers 58' are no longer interconnected to the conductive layers 58 since the interconnect plating 62 is removed in the hole 64. It is important that the back drilling process leaves intact the conductive layers 58, which results in a via stubs 66 extending from the last interconnected conductive layer 58. A via stub is a conductive portion of the via that is not connected in series with the electrical circuit. The longer the via stub, the greater the signal reflection and degradation. As such, it is desirable to minimize the length of the via stub. However, conventional back drilling processes have high variability and are difficult to control the length of the via stub. Additionally, back drilling is time consuming and expensive.

SUMMARY OF THE INVENTION

Embodiments are directed to a selective segment via plating process for manufacturing a circuit board having select inner layer connections as separate segments within the same via. Plating resist is applied to a conductive layer of an inner core and then stripped off after an electroless plating process. Stripping of the electroless plating on the plating resist results in a plating discontinuity on the via wall. In a subsequent electroplating process, the plug non-conductive layer can not be plated due to the plating discontinuity. The resulting circuit board structure has separate electrically interconnected segments within the via. The selective segment via plating process uses a single lamination step.

In an aspect, a circuit board is disclosed. The circuit board includes a laminated stack comprising a plurality of non-conductive layers and a plurality of conductive layers. The laminated stack further comprises an inner plug layer. The inner plug layer comprises one or more plating resist layers. A via is formed through the laminated stack, wherein walls of the via are plated with conductive material except where the via passes through the inner plug layer, thereby forming a via wall plating discontinuity. In some embodiments, each of the conductive layers is pattern etched. In some embodiments, the via comprises a single drill hole through an entirety of the laminated stack. In some embodiments, the via wall plating forms electrical interconnections with conductive layers intersecting the via, and the via wall plating discontinuity electrically isolates a first segment of electrically interconnected conductive layers from a second segment of electrically interconnected conductive layers. In some embodiments, the one or more plating resist layers are coupled to a conductive layer of the first segment and to a conductive layer of the second segment. In some embodiments, the one or more plating resist layers prevent formation of a plating stub extending from the first segment. In some embodiments, the one or more plating resist layers prevent formation of a plating stub extending from the second segment. In some embodiments, the circuit board also includes one or more additional inner core layers within the laminated stack, wherein each additional inner core layer forms an additional via wall plating discontinuity. In some embodiments, each additional via wall plating discontinuity results in an additional segment of electrically interconnected conductive layers. In some embodiments, the via wall plating discontinuity is aligned with the one or more plating resist layers. In some embodiments, the circuit board also includes a cavity extending from the via in the inner plug layer. In some embodiments, the inner plug layer comprises a plug non-conductive layer, a first plating resist layer coupled to a first surface of the plug non-conductive layer and a second plating resist layer coupled to a second surface of the plug non-conductive layer.

In another aspect, another circuit board is disclosed. The circuit board includes a laminated stack, a via formed through the laminated stack and a cavity extending from the via. The lamination stack includes a plurality of non-conducting layers and a plurality of conductive layers, wherein the laminated stack further comprises an inner plug layer comprising one or more plating resist layers. Walls of the via are plated with conductive material except where the via passes through the inner plug layer. The cavity extends from the via in the inner plug layer, wherein the cavity forms a via wall plating discontinuity. The via wall plating forms electrical interconnections with conductive layers intersecting the via, and the via wall plating discontinuity electrically isolates a first segment of electrically interconnected conductive layers from a second segment of electrically interconnected conductive layers. In some embodiments, each of the conductive layers is pattern etched. In some embodiments, the via comprises a single drill hole through an entirety of the laminated stack. In some embodiments, the one or more plating resist layers are coupled to a conductive layer of the first segment and to a conductive layer of the second segment. In some embodiments, the one or more plating resist layers prevent formation of a plating stub extending from the first segment. In some embodiments, the one or more plating resist layers prevent formation of a plating stub extending from the second segment. In some embodiments, the circuit board also includes one or more additional inner core layers within the laminated stack, wherein each additional inner core layer forms an additional via wall plating discontinuity. In some embodiments, each additional via wall plating discontinuity results in an additional segment of electrically interconnected conductive layers. In some embodiments, the via wall plating discontinuity is aligned with the one or more plating resist layers. In some embodiments, the inner plug layer comprises a plug non-conductive layer, a first plating resist layer coupled to a first surface of the plug non-conductive layer and a second plating resist layer coupled to a second surface of the plug non-conductive layer.

In yet another aspect, a multiple networked structure is disclosed. The multiple network structure includes a circuit board and a pin inserted in a via of the circuit board. The circuit board comprises a laminated stack and the via. The laminated stack comprises a plurality of non-conductive layers and a plurality of conductive layers, wherein the laminated stack further comprises an inner plug layer comprising one or more plating resist layers. The via is formed through the laminated stack. Walls of the via are plated with conductive material except where the via passes through the inner plug layer, thereby forming a via wall plating discontinuity. The via wall plating forms electrical interconnections with conductive layers intersecting the via, and the via wall plating discontinuity electrically isolates a first segment of electrically interconnected conductive layers from a second segment of electrically interconnected conductive layers. The pin is electrically coupled to each of the first and second segments to provide an independent electrical connection from each of the first and second segments to the pin.

In still yet another aspect, a method of manufacturing a circuit board is disclosed. The method includes forming a laminated stack. The laminated stack comprises a plurality of non-conductive layers, a plurality of conductive layers and an inner plug layer, wherein the inner plug layer comprises one or more plating resist layers. The method also includes forming a via through the laminated stack. The via passes through the one or more plating resist layers such that portions of a via wall corresponding to the one or more plating resist layers comprise plating resist. The method also includes stripping portions of the one or more plating resist layers exposed at the via. The method also includes performing an electroless plating process to plate the via wall such that portions of the plating are formed on the portions of the via wall comprising plating resist. The method also includes stripping the portions of the plating formed on the portions of the via wall comprising plating resist and stripping the portions of the one or more plating resist layers to form via wall plating discontinuities on the second via wall coincident with the one or more plating resist layers within the laminated stack. The method also includes performing an electroplating process to further plate remaining portions of the plating on the via wall while the via wall plating discontinuities are maintained. In some embodiments, the inner plug layer comprises a plug non-conductive layer, a first plating resist layer coupled to a first surface of the plug non-conductive layer and a second plating resist layer coupled to a second surface of the plug non-conductive layer. In some embodiments, performing the electroplating process dissolves a portion of the plating on the plug non-conductive layer, thereby forming a continuous via wall plating discontinuity across the entire inner plug layer. In some embodiments, stripping the portions of the plating and stripping the portions of the first plating resist layer and the second plating resist layer to form the via wall plating discontinuities from corresponding cavities extending from the via, wherein a first cavity is aligned with the first plating resist layer and a second cavity is aligned with the second plating resist layer in the laminated stack. In some embodiments, stripping portions of the one or more plating resist layers forms a cavity extending from the via.

In some embodiments, forming the laminated stack comprises forming a first subassembly comprising a first non-conductive layer, a first conductive layer coupled to a first surface of the first non-conductive layer, a second conductive layer coupled to a second surface of the first non-conductive layer, and a first plating resist layer coupled to the second conductive layer. Forming the laminated stack can also include forming a second subassembly comprising a second non-conductive layer, a third conductive layer coupled to a first surface of the second non-conductive layer, a fourth conductive layer coupled to a second surface of the second non-conductive layer, and a second plating resist layer coupled to the third conductive layer. Forming the laminated stack can also include stacking the first subassembly to the second subassembly such that the first plating resist layer faces the second plating resist layer. Forming the laminated stack can also include stacking at least an additional non-conductive layer and an additional conductive layer to the first conductive layer of the first subassembly and to the fourth conductive layer of the second subassembly, thereby forming a stack. Forming the laminated stack can also include laminating the stack to form the laminated stack. In some embodiments, stacking the first subassembly to the second subassembly comprises positioning a non-conductive layer there between.

In some embodiments, the method also includes pattern etching the conductive layers in the laminated stack. In some embodiments, the via wall plating forms electrical interconnections with conductive layers intersecting the via, and second via wall plating discontinuities electrically isolate a first segment of electrically interconnected conductive layers from a second segment of electrically interconnected conductive layers. In some embodiments, performing the electroplating process comprises applying electricity to the first segment and to the second segment. In some embodiments, the first plating resist layer prevents formation of a plating stub extending from the first segment. In some embodiments, the second plating resist layer prevents formation of a plating stub extending from the second segment. In some embodiments, forming the laminated stack further comprises including one or more additional inner core layers within the laminated stack, wherein each additional inner core layer forms additional via wall plating discontinuities. In some embodiments, each additional inner core layer results in an additional segment of electrically interconnected conductive layers. In some embodiments, forming the via comprises drilling a single drill hole through an entirety of the laminated stack.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 1 illustrates a cut out side view of a portion of a conventional printed circuit board.

FIG. 2 illustrates a cut out side view of a portion of two conventional subassembly stacks that are to be subsequently used to form a printed circuit board.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 3:
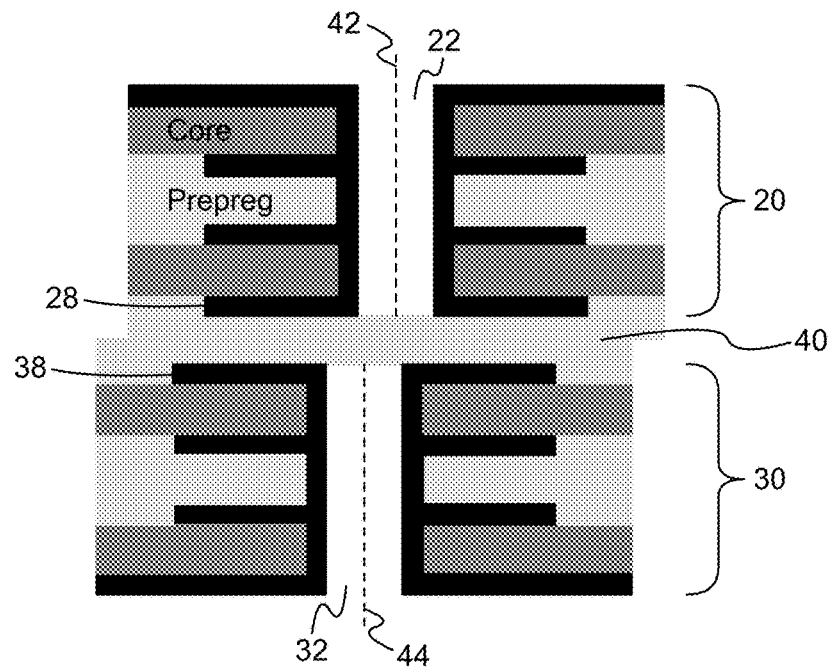
FIG. 3 illustrates the sequential lamination of the two subassembly stacks of FIG. 2.
Figure 4:
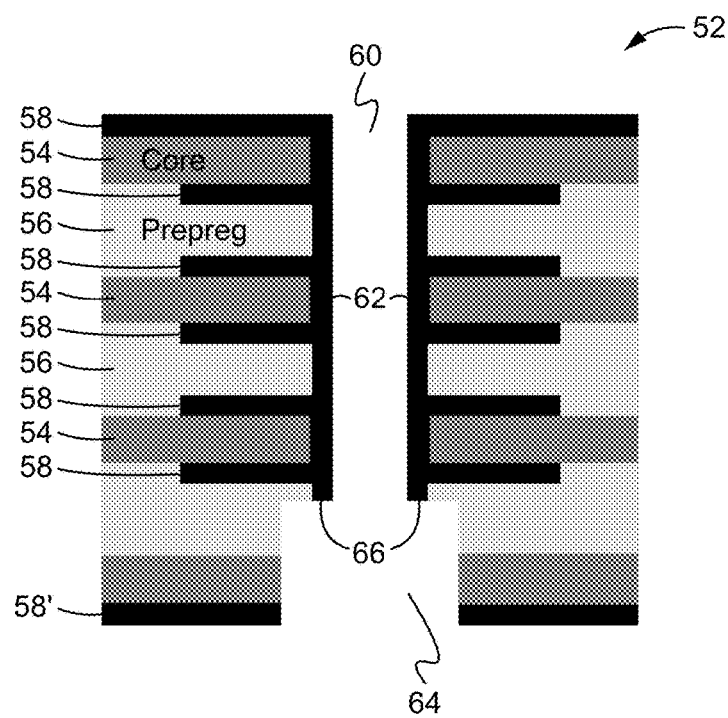
FIG. 4 illustrates a cut out side view of a portion of a conventional circuit board having the via back drilled.
Figure 5:
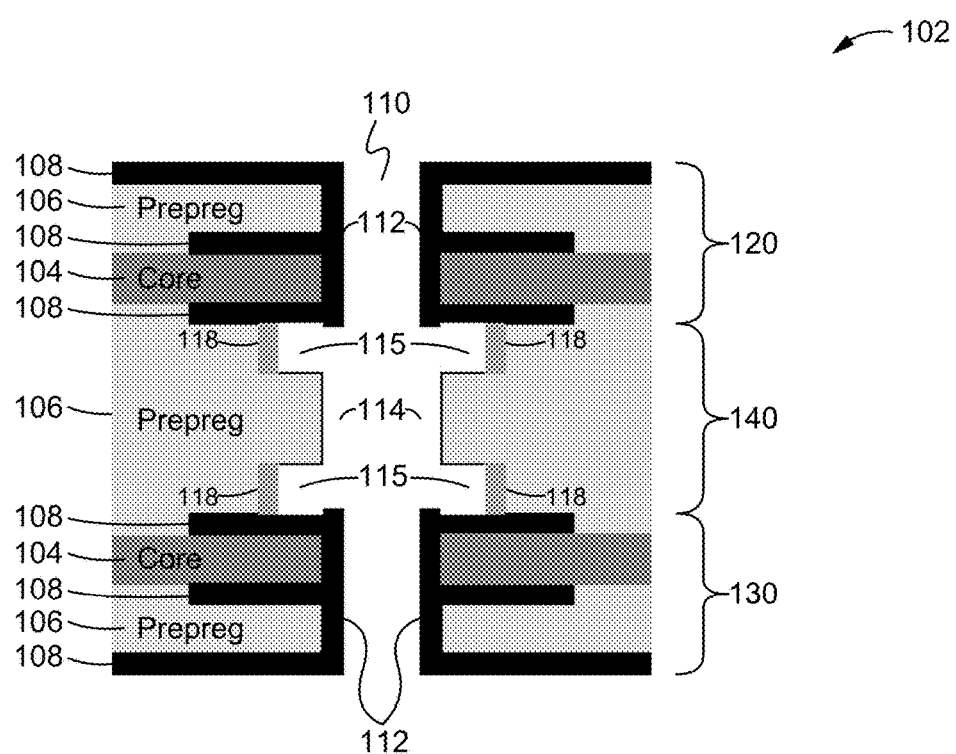
FIG. 5 illustrates a cut out side view of a portion of a printed circuit board according to an embodiment.
Figure 17:
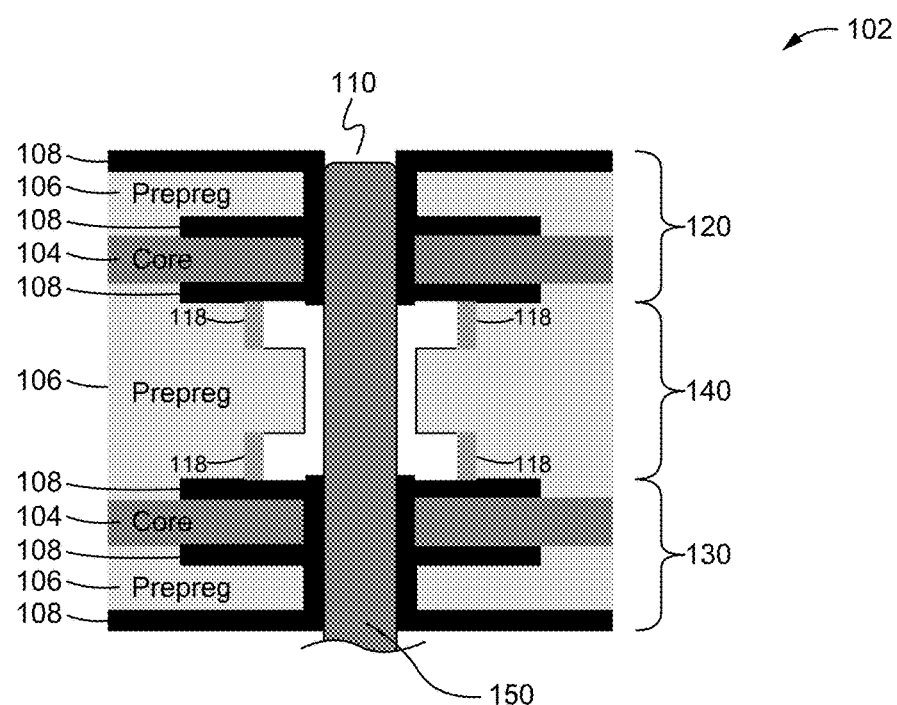
FIG. 17 illustrates the printed circuit board of FIG. 5 with a pin inserted into the via.

FIG. 5 illustrates a cut out side view of a portion of a printed circuit board according to an embodiment. The printed circuit board 102 is manufactured using a selective segment via plating process, an embodiment of which is described in relation to FIGS. 6-12. The printed circuit board 102 includes a plurality of stacked layers, the layers made of non-conductive layers 104, 106 and conductive layers 108. The non-conductive layers can be made of prepreg or base material that is part of a core structure or a plug subassembly. A core structure includes a non-conductive layer, such as a base material, and a patterned conductive layer on one or both opposing surfaces of the non-conductive layer. A plug subassembly is formed by applying a plating resist layer to a surface of a core structure. The inner plug layer 140 is formed by adjacently positioning two plug assemblies each having a plating resist layer 118. In the exemplary configuration shown in FIG. 5, an intervening non-conductive layer 106, such as prepreg, is positioned between the two plating resist layers 118. A laminated stack is formed by stacking multiple plug assemblies and core structures with intervening non-conductive material, such as prepreg, and then laminating the stack. Any conventional lamination technique can be used. The exemplary laminated stack shown in FIG. 5 has two plug assemblies. It is understood that the laminated stack can be made having more or less than two plug assemblies. The exemplary laminated stack shown in FIG. 5 does not include core structures that have not been formed into plug assemblies. It is understood that the laminated stack can be made to include one or more core structures that have not been formed into plug assemblies. A via 110 is formed by drilling a hole through the laminated stack and plating the wall of the hole with electrically conductive material, such as copper. The resulting plating 112 interconnects select conductive layers 108. The inner plug layer 140 is selectively positioned during formation of the laminated stack to divide the printed circuit board 102 into segments 120 and 130. The plug 140 includes plating resist 118 that prohibits formation of the plating 112 in cavities 115 and area 114 during the plating process. As a result, the plating 112 in the segment 120 is disconnected from the plating 112 in the segment 130. This results in the via 110 having two electrically isolated segments 120 and 130. A segment can also be referred to as a net, which is an electrical sub-circuit. Each segment provides an independent electrical connection to a pin inserted into the via, such as pin 150 inserted into via 110 as shown in FIG. 17. As such, the printed circuit board having multiple segments is a multi-net structure.

In this embodiment, selective positioning of two plating resist layers 118 substantially eliminates formation of plating stubs extending from the conducting layers 108 most proximate the cavities 115. In some embodiments, a thin layer of plating deposited on an exposed surface of the conductive layer 108 within the cavity 115 does remain.

The number of layers in the PCB 102 and the position of the plug 140 within the laminated stack shown in FIG. 5 is for exemplary purposes only. The selective segment via plating process allows freedom in interconnecting various sequential inner conductive layers as separate segments within the same via. In the exemplary configuration shown in FIG. 5, the top three conductive layers are interconnected as one segment, and the bottom three conductive layers are interconnected as another segment. It is understood that not all segments need have the same number of interconnected conductive layers. It is also understood that a segment can have more or less than three interconnected conductive segments. In the exemplary configuration shown in FIG. 5, a single plug 140 is interspersed within the printed circuit board 102. Alternatively, multiple such plugs can be interspersed within the printed circuit board. Inclusion of additional plugs results in additional segments being formed.

Figure 6:
FIGS. 6-12 illustrate various steps in the selective segment via plating process used to manufacture the printed circuit board in FIG. 5.

Figures 6-12 illustrate various steps in the selective segment via plating process used to manufacture the printed circuit board 102 in FIG. 5. Each of the FIGS. 6-12 illustrates a cut out side view of the printed circuit board according to the various process steps. In FIG. 6, a plug subassembly 122 is formed. The plug subassembly 122 includes a core structure and a plating resist layer 118 formed on a surface of the core structure. The core structure is a metal clad base material including a non-conductive base material layer 104 and conductive layers 108 formed on both opposing surfaces. It is understood that an alternative core structure can be used which includes a conductive layer on only one surface of the non-conductive layer. The plating resist layer 118, such as liquid photoimageable plating resist, is applied to one of the conductive layers 108. It is understood that other types of plating resist can be used that are resistant to a subsequent via wall plating step. One or more additional plug assemblies are similarly fabricated. Each inner plug layer is fabricated using two plug subassemblies. As such, the number of plug assemblies fabricated depends on the number of inner plug layers to be included in the laminated stack. In the exemplary embodiment of FIG. 5, a single inner plug layer is included in the laminated stack and as such two plug subassemblies are fabricated. Optionally, in the case where the printed circuit board is to include one or more core structures that are not formed into plug subassemblies, these one or more core structures can be fabricated at this stage.

Figure 7:

In FIG. 7, a laminated stack is formed. The plug subassembly 122 is laminated to another plug subassembly 122' with an intervening non-conductive layer 106. The plug subassembly 122 and the plug subassembly 122' are oriented such that the respective plating resist layers 118 of each subassembly are facing each other, as shown in FIG. 7. In the exemplary configuration shown in FIG. 7, additional conductive layers 108 and intervening non-conductive layers 106 are added to the top and bottom of the stack. A single lamination step results in the laminated stack shown in FIG. 7. The additional conductive layers 108 on the top and bottom of the laminated stack are pattern etched.

Figure 8:
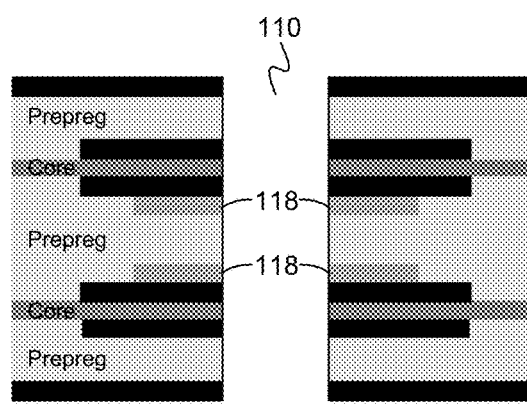

In FIG. 8, a hole is drilled through the laminated stack of FIG. 7 to form via 110. Formation of the via 110 leaves plating resist 118 exposed on the side wall of the via 110.

Figure 9:
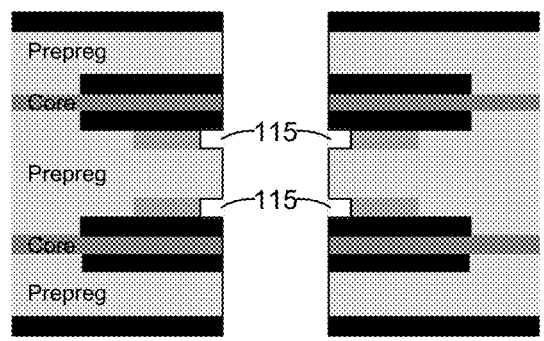

In FIG. 9, a first plating resist stripping process is performed. During the first plating resist stripping process, a portion of the plating resist material 118 is removed. Another portion of the plating resist 118 remains after the plating resist stripping step. Stripping of the portion of the plating resist results in a cavity 115 surrounding the via 110 at each of the plating resist layers 118.

Figure 10:
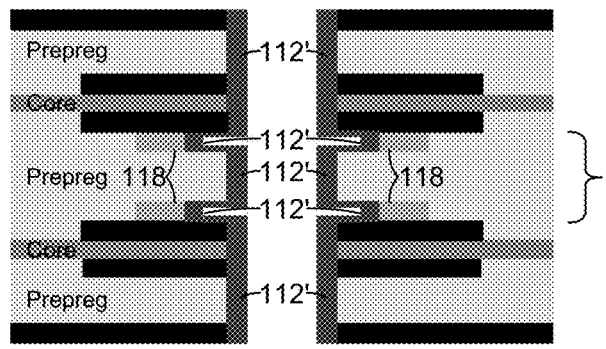

In FIG. 10, a desmear process is performed to remove residue within the via 110. Next, an electroless plating process is performed to form plating 112' on the side walls of the via 110. In some embodiments, copper is used as the plating material. It is understood that other plating materials can be used. The plating 112' forms an interconnect with the various conductive layers 108. In the area of the plug 140, the plating 112' is formed on the plating resist 118 within the cavities 115 and exposed plug non-conductive layer 106 between the two plating resist layers 118.

Figure 11:
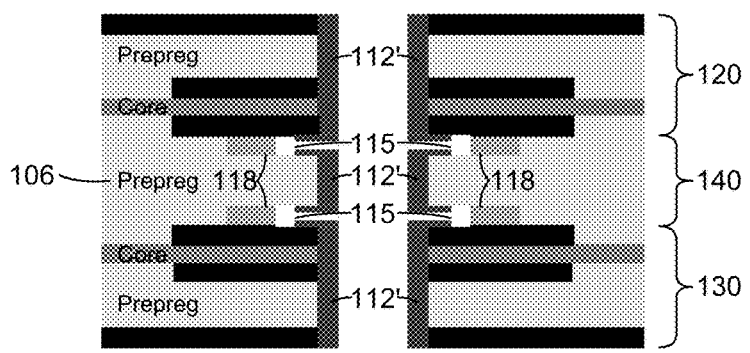

In FIG. 11, a second plating resist stripping process is performed. During the second plating resist stripping process, both the plating 112' attached to the plating resist layers 118 and another portion of the plating resist material 118 is removed, further extending the cavities 115. The plating 112' deposited during the electroless plating process in FIG. 10 does not deposit well onto the plating resist 118 and therefore the plating resist 118 is not completely covered by the plating 112'. Also, the adhesion bond between the plating 112' and the plating resist 118 is not as strong as the adhesion bond between the plating 112' and the other layers exposed in the via. As such, during the plating resist stripping process, the stripping chemistry attacks the plating resist 118 at locations lacking coverage by the plating 112'. As the plating resist 118 dissolves, there is no support for the portion of the plating 112' deposited on the plating resist 118 and this portion of the plating 112' is removed. A residual amount of plating resist 118 remains after the second plating resist stripping step.

Figure 12:
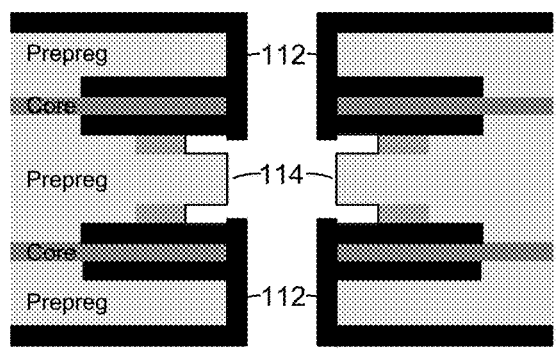

In FIG. 12, an electroplating process is performed resulting in a thicker plating 112 on the side walls of the via 110. In some embodiments, copper is used as the plating material. To perform the electroplating process, electricity is applied to the segments 120 and 130. However, due to the via wall plating discontinuities at the plating resist layers 118, the plating 112' attached to the plug non-conducting layer 106 between the two plating resist layers 118 is not electrically connected. As such, this plating 112' is dissolved by an electroplating chemistry applied during the electroplating process. Dissolving of this plating 112' forms a cavity 114 formed in the via 110 relative to the plating 112, thereby resulting in a via wall plating discontinuity across the entire inner plug layer 140.

Figure 13:
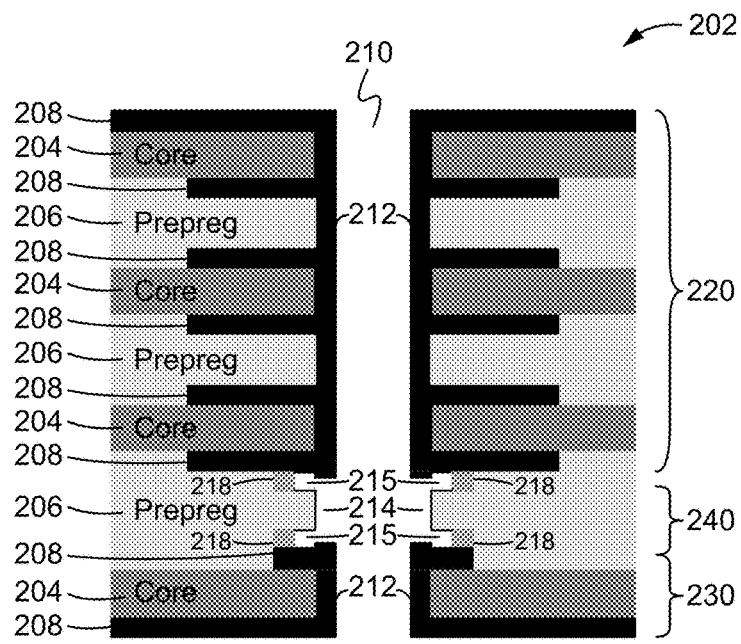
FIG. 13 illustrates a cut out side view of a portion of a printed circuit board according to another embodiment.

In some embodiments, the plug is positioned other than in the middle of the laminated stack. FIG. 13 illustrates a cut out side view of a portion of a printed circuit board according to another embodiment. The printed circuit board 202 includes a plurality of stacked layers, the layers made of non-conductive layers 204, 206 and conductive layers 208 laminated to an inner plug layer 240 to form a laminated stack with a via 210 having plating 212 in a similar manner as previously described. The inner plug layer 240 can be formed similarly as the plug 140 in FIGS. 6-8. The resulting inner plug layer 240 includes cavities 214 and 215 which form a continuous via wall plating discontinuity across the entire inner core layer 240.

FIG. 13 also illustrates an additional functionality where the inner plug layer is selectively positioned toward the "back" of the circuit board, thereby effectively isolating a select number of conductive layers at the back side, for example segment 230, from the segment 220 in a manner similar to back drilling. However, in the case of the selective segment via plating process, there are no via stubs as there are in a conventional back drilling process.

Figure 14:
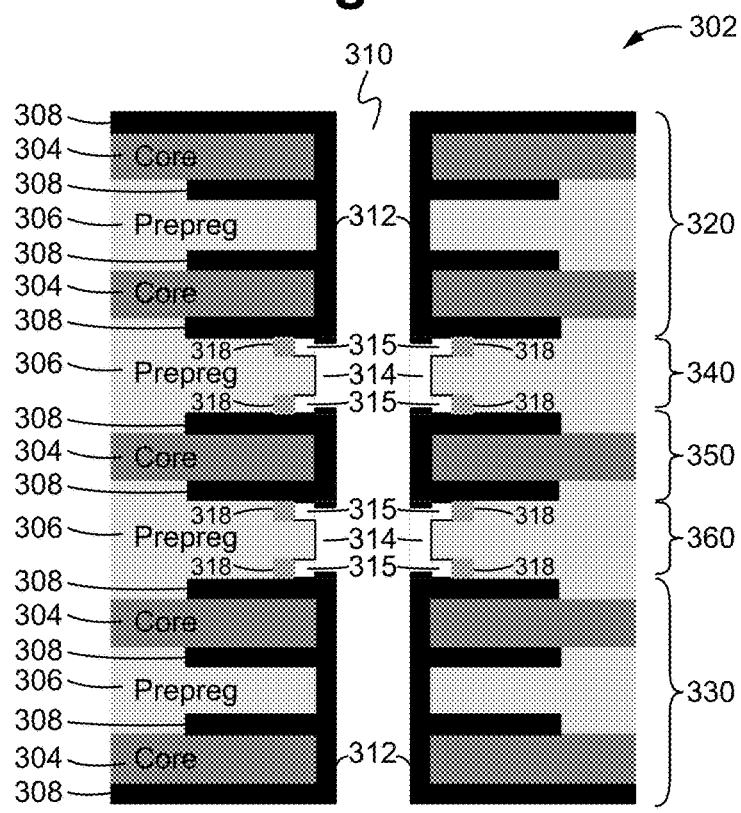
FIG. 14 illustrates a cut out side view of a portion of a printed circuit board according to yet another embodiment.

In the embodiments above, a single inner plug layer is included in the laminated stack. In other embodiments, the laminated stack can include multiple inner plug layers. FIG. 14 illustrates a cut out side view of a portion of a printed circuit board according to yet another embodiment. The printed circuit board 302 includes two inner plug layers 340 and 360. The inner plug layers can be made in a similar manner as that previously described, such as by laminating together two plug subassemblies. In the exemplary embodiment shown in FIG. 14, a plug subassembly can be fabricated that has a plating resist layer applied to each conductive layer of the core structure, in contrast to the single plating resist layer of plug subassembly 122 in FIG. 6. This plug subassembly having plating resist layers on opposing sides is the foundation for the segment 350 shown in FIG. 14. Two plug subassemblies of a similar type as the plug subassembly 122 can then be stacked with the two-sided plating resist plug subassembly to form the inner plug layers 340 and 360. Additional layers made of non-conductive layers 304, 306 and conductive layers 308 are stacked to the inner plug layers 340 and 360, and the resulting stack is laminated to form a laminated stack. The laminated stack is then drilled to form via 310. A first plating resist stripping step, an electroless plating step, a second plating resist stripping step and an electroplating step are performed in a manner similar to that described above. The resulting inner plug layers 340 and 360 each include plating resist layers 318 and cavities 314 and 315 that form a via wall plating discontinuity across the entire inner plug layer. With the addition of the second inner plug layer, an additional segment 350 is formed.

Figure 15:
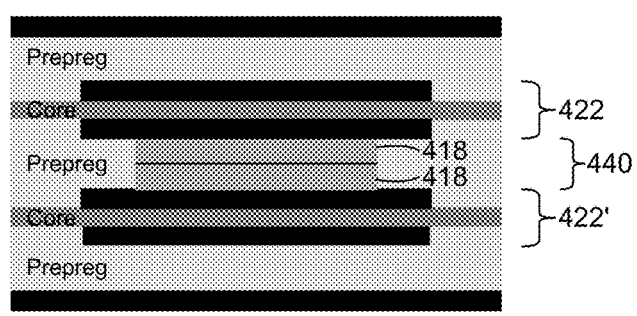
FIG. 15 illustrates an alternative lamination step
Figure 16:
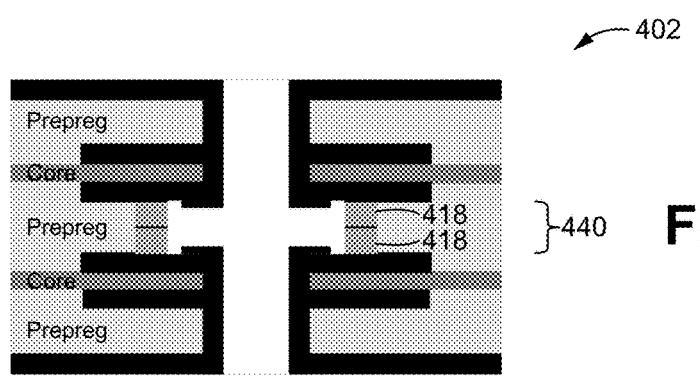
FIG. 16 illustrates an exemplary printed circuit board resulting from the lamination step of FIG. 15.

In the embodiments above, an inner plug layer is formed by laminating two plug subassemblies with a non-conductive layer between the respective plating resist layers of each plug subassembly. Alternatively, the two plug subassemblies can be laminated together without an intervening non-conductive layer between the respective plating resist layers of each plug subassembly. FIG. 15 illustrates an alternative lamination step The laminated stack is fabricated using two plug subassemblies 422 and 422' where the respective plating resist layers 418 of each plug subassembly 422 and 422' are laminated together with plug non-conductive layer which has the portion removed at a location of the plating resist layers 418 to form the foundation of a plug 440. FIG. 16 illustrates an exemplary printed circuit board 402 resulting from the lamination step of FIG. 15.

In the embodiments above, an inner core layer is formed by laminating two plug subassemblies with a non-conductive layer between the respective plating resist layers of each plug subassembly. Alternatively, the two plug subassemblies can be laminated together without an intervening non-conductive layer between the respective plating resist layers of each plug subassembly. FIG. 15 illustrates an alternative lamination step The laminated stack is fabricated using two plug subassemblies 422 and 422' where the respective plating resist layers 418 of each plug subassembly 422 and 422' are laminated together with plug non-conductive layer which has the portion removed at a location of the plating resist layers 118 to form the foundation of a plug 440. FIG. 16 illustrates an exemplary printed circuit board 402 resulting from the lamination step of FIG. 15.

It is understood that the various structural configurations and the position of the plugs shown in the embodiments of FIGS. 6-16 can be interchanged according to a specific application and application requirement.

The selective segment via plating process allows freedom in connecting inner layers as separate segments within a via. The selective segment via plating process can replace back drilling and sequential lamination processes while achieving the same design as these two processes. This saves running cost and shortens PCB processing time. Compared to uncontrollable stub length in the conventional back drill process, the selective segment via plating process substantially eliminates plating stubs and therefore improves signal transfer integrity. A plating stub is a conductive portion of the via plating not connected in series with the circuit. By substantially eliminating plating stubs, signal reflection and degradation can be minimized as signal travels along the via. Elimination of a back drilling step also conserves useable real estate on the printed circuit board as the physical size of the drill bit requires additional spacing of adjacently drilled holes. Compared to sequential lamination, the selective segment via plating process requires a single assembly lamination which gives exact via alignment through the entire thickness of the printed circuit board, which provides better overall layer to layer registration and hence more room for circuitry routing. The selective segment via plating process also enables a one-time drilling step.

The present application has been described in terms of specific embodiments incorporating details to facilitate the understanding of the principles of construction and operation of the flexible printed circuits having attached rigid components. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A circuit board comprising:
a laminated stack comprising a plurality of non-conductive layers and a plurality of conductive layers, wherein the laminated stack further comprises an inner plug layer comprising a plurality of plating resist layers, the inner plug layer stacked within an interior of the laminated stack;
a via formed through the laminated stack, wherein side walls of the via are plated with conductive material except where the via passes through the inner plug layer, thereby forming a via side wall plating discontinuity, wherein the via side walls define a via diameter, and a surface of the via side wall plating facing into the via defines a plated via diameter that is less than the via diameter; and
a plurality of cavities, one cavity for each plating resist layer, each cavity extending transversely from a longitudinal axis of the via at a same layer within the lamented stack as a corresponding plating resist layer, wherein each cavity is defined by cavity side walls that are recessed from the via side walls and by top and bottom surfaces corresponding to layers of the laminated stack adjacently laminated to both sides of the corresponding plating resist layer, wherein the cavity side wall comprises plating resist.

2. The circuit board of claim 1 wherein each of the conductive layers is pattern etched.

3. The circuit board of claim 1 wherein the via comprises a single drill hole through an entirety of the laminated stack.

4. The circuit board of claim 1 wherein the via wall plating discontinuity is aligned with the inner plug layer.

5. The circuit board of claim 1 wherein the inner plug layer comprises a plug non-conductive layer, a first plating resist layer coupled to a first surface of the plug non-conductive layer and a second plating resist layer coupled to a second surface of the plug non-conductive layer, wherein the first plating resist layer is coupled to a first conductive layer of the plurality of conductive layers in the laminated stack and the second plating resist layer is coupled to a second conductive layer of the plurality of conductive layers in the laminated stack.

6. A circuit board comprising:
a laminated stack comprising a plurality of non-conducting layers and a plurality of conductive layers, wherein the laminated stack further comprises an inner plug layer comprising a plurality of plating resist layers, the inner plug layer, stacked within an interior of the laminated stack;
a via formed through the laminated stack, wherein side walls of the via are plated with conductive material except where the via passes through the inner plug layer, wherein the via side walls define a via diameter, and a surface of the via side wall plating facing into the via defines a plated via diameter that is less than the via diameter; and
a plurality of cavities, one cavity for each plating resist layer, each cavity extending transversely from a longitudinal axis of the via at a same layer within the lamented stack as a corresponding plating resist layer, wherein each cavity forms a via side wall plating discontinuity, further wherein each cavity is defined by cavity side walls that are recessed from the via side walls and by top and bottom surfaces corresponding to layers of the laminated stack adjacently laminated to both sides of the corresponding plating resist layer, wherein the cavity side wall comprises plating resist, further wherein the via wall plating forms electrical interconnections with conductive layers intersecting the via, and the via wall plating discontinuity electrically isolates a first segment of electrically interconnected conductive layers from a second segment of electrically interconnected conductive layers.

7. The circuit board of claim 6 wherein each of the conductive layers is pattern etched.

8. The circuit board of claim 6 wherein the via comprises a single drill hole through an entirety of the laminated stack.

9. The circuit board of claim 6 wherein a first plating resist layer of the plurality of plating resist layers is coupled to a conductive layer of the first segment and a second plating resist layer of the plurality of plating resist players is coupled to a conductive layer of the second segment.

10. The circuit board of claim 9 wherein the first plating resist layer prevents formation of a plating stub extending from the first segment.

11. The circuit board of claim 10 wherein the second plating resist layer prevents formation of a plating stub extending from the second segment.

12. The circuit board of claim 6 further comprising one or more additional inner plug layers within the laminated stack, wherein each additional inner plug layer forms an additional via wall plating discontinuity.

13. The circuit board of claim 12 wherein each additional via wall plating discontinuity results in an additional segment of electrically interconnected conductive layers.

14. The circuit board of claim 6 wherein the via wall plating discontinuity is aligned with the inner plug layer.

15. The circuit board of claim 6 wherein the inner plug layer comprises a plug non-conductive layer, a first plating resist layer coupled to a first surface of the plug non-conductive layer and a second plating resist layer coupled to a second surface of the plug non-conductive layer, wherein the first plating resist layer is coupled to a first conductive layer of the plurality of conductive layers in the laminated stack and the second plating resist layer is coupled to a second conductive layer of the plurality of conductive layers in the laminated stack.

16. The circuit board of claim 1 further comprising a pin inserted in the via, wherein the pin is electrically coupled to each of the first and second segments to provide an independent electrical connection from each of the first and second segments to the pin.

* * * * *